United States Patent [19]
Kurashima

[11] Patent Number: 5,353,364
[45] Date of Patent: Oct. 4, 1994

[54] OPTICAL MODULE WITH IMPROVED GROUNDING OF AN OPTICAL ELEMENT

[75] Inventor: Hiromi Kurashima, Kanagawa, Japan

[73] Assignee: Sumitomo Electric Industries, Ltd., Osaka, Japan

[21] Appl. No.: 104,012

[22] Filed: Aug. 10, 1993

[30] Foreign Application Priority Data

Aug. 11, 1992 [JP] Japan .................................. 4-214347
Aug. 20, 1992 [JP] Japan .................................. 4-221436

[51] Int. Cl.⁵ ............................ G02B 6/00; G02B 6/36
[52] U.S. Cl. ......................................... 385/88; 385/70; 257/433
[58] Field of Search .................... 385/70, 76, 88–94, 385/39; 257/21, 79, 81, 212, 431, 432, 433

[56] References Cited

U.S. PATENT DOCUMENTS

| | | | |
|---|---|---|---|
| 4,149,072 | 4/1979 | Smith et al. | 385/24 X |
| 4,979,787 | 12/1990 | Lichtenberger | 385/88 |
| 5,069,522 | 12/1991 | Block et al. | 385/39 |
| 5,113,466 | 5/1992 | Acarlar et al. | 385/88 |
| 5,123,066 | 6/1992 | Acarlar | 385/14 |
| 5,170,453 | 12/1992 | Go et al. | 385/70 |

FOREIGN PATENT DOCUMENTS

| | | |
|---|---|---|
| 0279359 | 8/1988 | European Pat. Off. |
| 0389824 | 10/1990 | European Pat. Off. |
| 0437931 | 7/1991 | European Pat. Off. |
| 0472755 | 3/1992 | European Pat. Off. |
| 2271308 | 11/1990 | Japan |

*Primary Examiner*—Akm E. Ullah
*Attorney, Agent, or Firm*—Cushman, Darby & Cushman

[57] ABSTRACT

An optical functional element is contained in and grounded to a metal package. A grounding lead member, which is connected to a grounding lead pin forming portion via a connecting lead portion, is welded to the outer surface of the metal package either before or after resin molding.

13 Claims, 6 Drawing Sheets

OPTICAL MODULE WITH IMPROVED GROUNDING OF AN OPTICAL ELEMENT

BACKGROUND OF THE INVENTION

The present invention relates to an optical module used in optical communication systems, such as a data link and an optical LAN, which utilize light as an information transmitting medium. The invention also relates to a manufacturing method of such an optical module.

The above optical module is classified into two types: a transmitting module having as an optical functional element a light-emitting element such as a semiconductor laser, and a receiving module having as an optical functional element a photodetecting element such as a p-i-n photodiode. For example, U.S. Pat. No. 5,170,453 (corresponding to Japanese Patent Application Unexamined Publication No. Hei. 2-271308) discloses an optical module of this type which enables cost reduction due to a reduced number of parts and the mass-production effect, and which is superior in reliability and durability.

Figure 1:
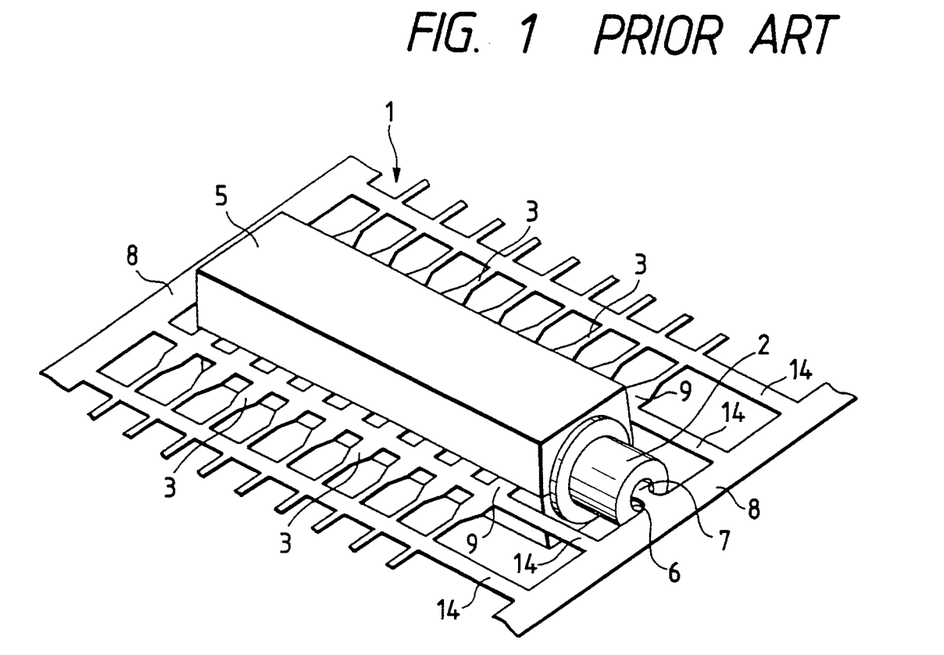
FIG. 1 is a perspective view of an assembly of a conventional optical module in a state after resin molding and before cutting out unnecessary portions of a lead frame.
Figure 2:
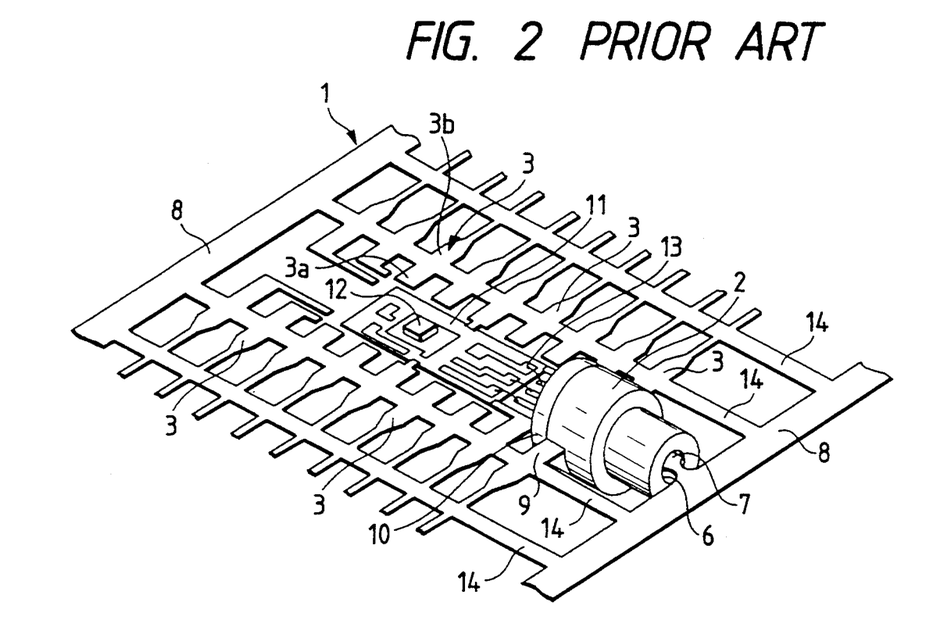
FIG. 2 is a perspective view of an assembly of the optical module of FIG. 1 in a state before the resin molding.

An optical module manufacturing method disclosed in the above patent is summarized below with reference to FIGS. 1 and 2. FIG. 1 shows an assembly of an optical module 1 in a state immediately after resin molding. In this state, an optical connector 2 and lead pins 3 of a lead frame 8 are held by a resin mold member 5. FIG. 2 shows an assembly before being set in metal dies for the resin molding. In FIG. 2, a support member 7 is inserted into a ferule insertion hole 6 to thereby support the optical connector 2 by the lead frame 8. To hold the optical connector 2 more stably, it is further supported by a holding member 9 of the lead frame 8.

As shown in FIG. 2, terminals extending in front of a metal package 10 that is unified with the optical connector 2 and containing an optical functional element are connected by wires 13 to terminals of electronic circuit parts 12 mounted on a circuit board 11 that is placed on the lead frame 8. The lead frame 8 has inner leads 3a and outer leads 3b of the lead pins 3, a mother land (not shown) located inside the inner leads 3a and supporting the circuit board 11, and tie-bars 14 for holding the mother land, lead pins 3, etc.

In the state of FIG. 2, the lead frame 8 and the respective parts are set in metal dies (not shown), and a plasticized resin material is pressure-injected into the metal dies. The resin material is molded as shown in FIG. 1, and the respective parts are held by the resin mold member 5. Finally, the optical module 1 is completed by cutting out unnecessary portions of the lead frame 8.

Compared with the preceding optical module manufacturing method in which respective parts are fixed to a ceramic package with an adhesive, the above method is superior in that it enables cost reduction and mass-production due to rationalization of a manufacturing process. However, although in the above method sufficient studies and improvements have been made of the rationalization of the manufacturing process and the reliability of the molding step using the resin material, no improvements have been made of the grounding of the optical element and the electronic circuits.

In general, in the above optical module, the optical functional element and the electronic circuits are connected to each other by wiring. However, for instance in the case of an optical module in which an optical data link using a laser diode is molded with a resin material, the method of connecting the laser diode and the electronic circuits only by wiring cannot provide sufficient grounding performance, preventing the optical module from exhibiting satisfactory characteristics. Similarly, an optical module having a photodetecting element is susceptible to noises because of insufficient grounding performance.

SUMMARY OF THE INVENTION

The present invention has been made to solve the above problems in the art, and has an object of providing an optical module in which an optical element is grounded more properly. Another object of the invention is to provide a manufacturing method of such an optical module.

According to the invention, an optical module comprises:

an optical connector for receiving an end of an optical fiber to be connected to the optical module;
an optical functional element to be optically coupled with the optical fiber;
a metal package fixed to the optical connector and containing the optical functional element, the optical functional element being grounded to the metal package;
electronic circuit parts electrically connected to the optical functional element;
a circuit board on which the electronic circuit parts are mounted;
a plurality of lead pins electrically connected to the electronic circuit parts;
at least one grounding member electrically connected to the metal package;
a grounding lead pin electrically connected to the grounding lead member; and
a resin mold member holding the metal package, electronic circuit parts, circuit board, lead pins, grounding member and grounding lead pin.

According to another aspect of the invention, a manufacturing method of an optical module comprises the steps of:

preparing an assembly comprising a lead frame including a plurality of lead pin forming portions, at least one grounding lead member and a grounding lead pin forming portion electrically connected to the grounding lead member, a circuit board having electronic circuit parts and mounted on the lead frame, an optical connector supported by the lead frame, a metal package fixed to the optical connector and containing an optical functional element electrically connected to the electronic circuit parts and grounded to the metal package;
electrically connecting the grounding lead member to the metal package; and
molding the assembly with a resin to hold the metal package, electronic circuit parts, circuit board, lead pin forming portions, grounding lead member and grounding lead pin forming portion; and
cutting out unnecessary portions of the lead frame.

Alternatively, the molding step may be performed before the step of connecting the grounding lead member to the metal package.

DESCRIPTION OF THE PREFERRED EMBODIMENTS

Embodiments of the present invention are described below with reference to the accompanying drawings.

Figure 3:
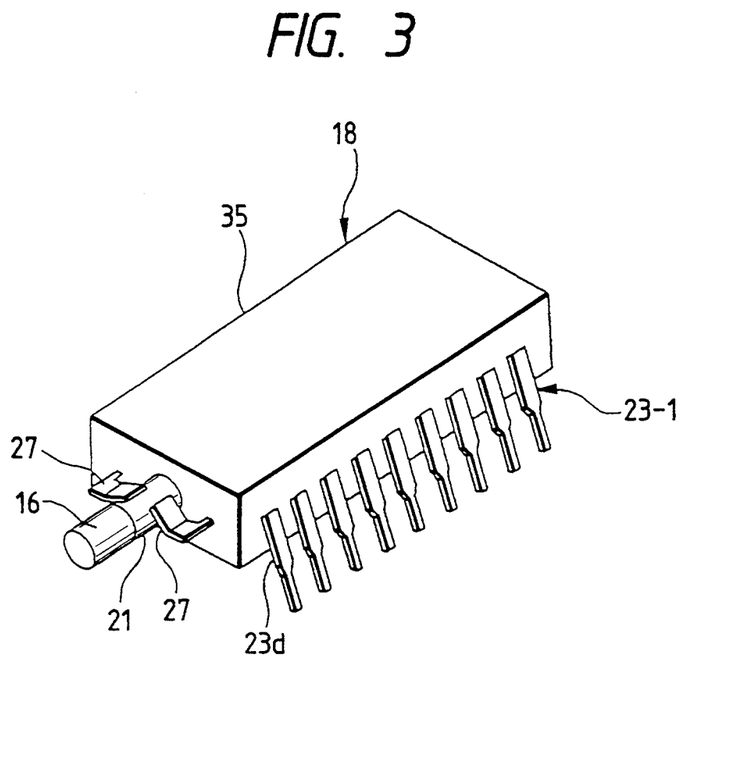
FIG. 3 is a perspective view of a single-fiber optical module according to an embodiment of the invention.
Figure 4:
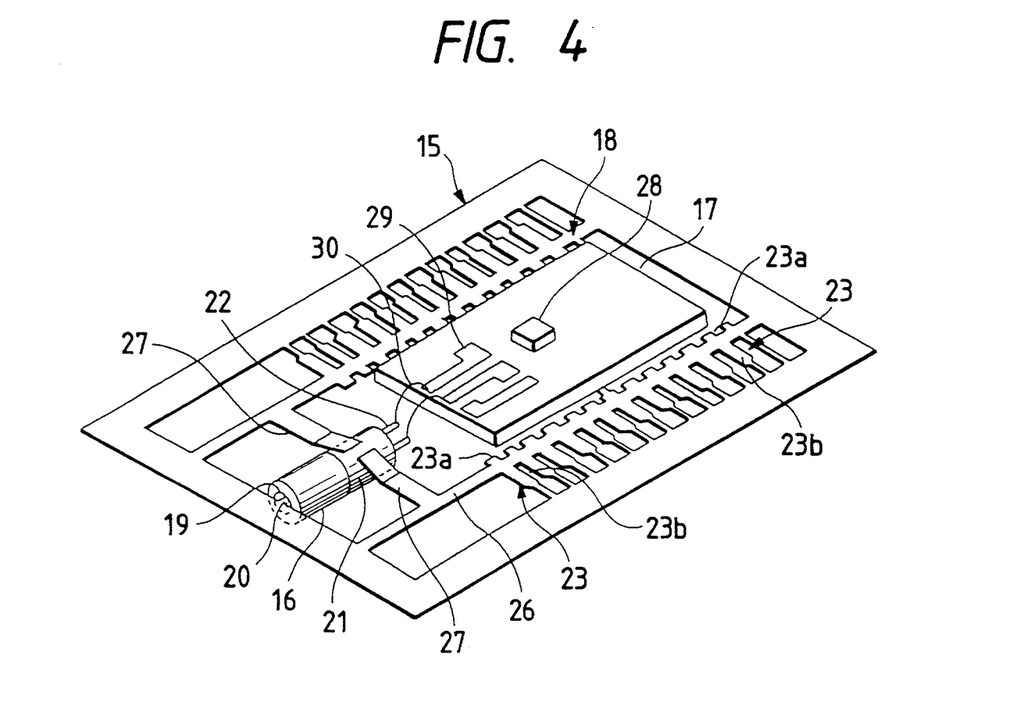
FIG. 4 is a perspective view of an assembly of the single-cable optical module of FIG. 3 in a state before resin molding.
Figure 5:
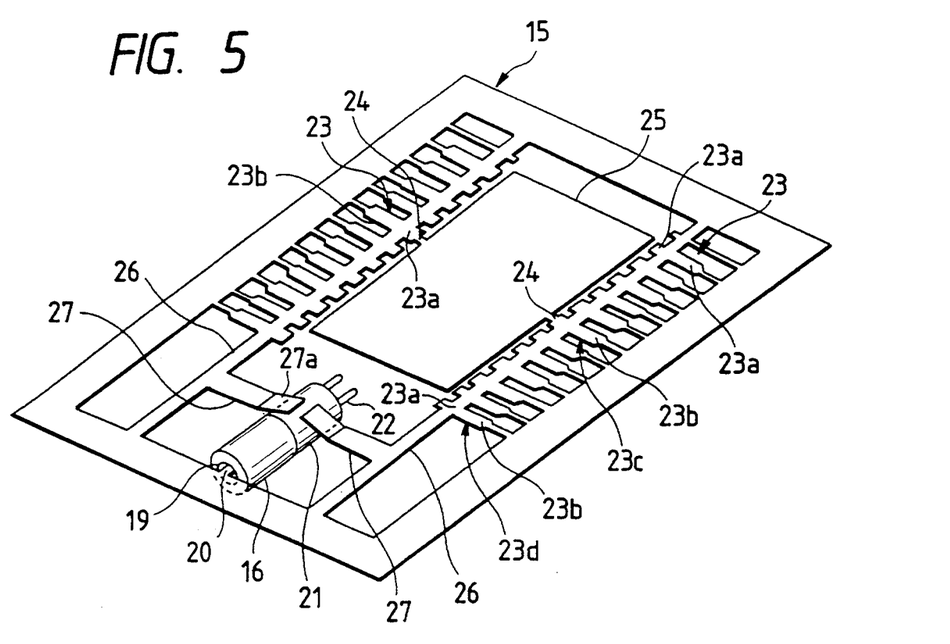
FIG. 5 is a perspective view of an assembly of the optical module of FIG. 3 in a state before a circuit board is mounted on a lead frame.

FIG. 3 is a perspective view of an optical module 18 according to an embodiment of the invention, which is a single-fiber optical link. FIG. 4 is a perspective view of an assembly in a state before being set in metal dies, and FIG. 5 is a perspective view in which a circuit board 17 is removed from a lead frame 15 of the FIG. 4 assembly.

Referring to FIG. 3, in the optical module 18, electronic circuit parts (described later) are embedded in a resin mold member 35, and lead pins 23-1, which are partially exposed from the resin mold member 35, are connected to the electronic circuit parts in the resin mold member 35. A metal package 21, in which an optical functional element (not shown) is incorporated, is unified with an optical connector 16. A part of the metal package 21 is exposed from the resin mold member 35. Grounding lead members 27 are electrically connected to the exposed part of the metal package 21 by welding etc. Each grounding lead member 27 is connected, in the resin mold member 35, to a grounding lead pin 23d, which is one of the lead pins 23-1.

A manufacturing method of the optical module 18 is described below with reference to FIGS. 4 and 5. A support member 20 is inserted into a ferule insertion hole 19, so that the optical connector 16 is supported by a lead frame 15. As described above, the optical connector 16 is unified with the metal package 21 having the optical functional element (not shown). Terminals 22 of the optical functional element are protruded from the end face of the metal package 21. The optical functional element is grounded to the metal package 21.

In general, the lead frame 15 is formed into a predetermined shape by etching or punching by a press machine a Fe-Ni(42%) alloy or copper sheet of about 0.25-mm thickness.

As shown in FIG. 5, the lead frame 15, which is an integral part, includes a plurality of lead pin forming portions 23 having inner lead portions 23a and outer lead portions 23b, a mother land 25 supported by tie-bars 24 that are integral with the corresponding inner lead portions 23a, and grounding lead members 27 which are connected to the corresponding lead pin forming portions 23 via respective connecting lead portions 26.

The grounding lead members 27 are provided on both sides of the metal package 21, and the end portion of each grounding lead member 27 is somewhat bent upward, i.e., inclined (see FIG. 5). An inclined tip portion 27a is in contact with the outer surface of the metal package 21. The electrical connection between the grounding lead members 27 and the metal package 21 is effected by welding, brazing, or bonding with a conductive resin. The welding may be laser resistance welding or spot welding, and solder or silver may be used for the brazing.

As shown in FIG. 4, a circuit board 17 having electronic circuit parts 28 is mounted on the mother land 25 of the lead frame 15. The terminals 22 of the optical functional element are electrically connected to a wiring pattern 29 for the electronic circuit parts 28 by wires 30.

In the state of FIG. 4, the respective parts including the lead frame 15 are set in transfer molding metal dies (not shown), and a plasticized resin is pressure-injected into the metal dies. The resin is molded, so that the respective parts are held by a resin mold member (not shown). Then, unnecessary portions such as connecting portions between the adjacent lead pin forming portions 23 and portions outside the outer lead portions 23b are cut out using cutter metal dies, to insulate the respective lead pins from each other.

In a step before the above resin molding, the electronic circuit parts 28 and the inner lead portions 23a are connected by wires. While the present invention is the same as the conventional case in this respect, the former is different from the latter in that arbitrary two of the lead pin forming portions 23 are used as grounding lead pin forming portions 23c and 23d (see FIG. 5), to which the circuit board 17 and the metal package 21 are electrically connected, respectively.

In the case of FIG. 5, the grounding lead pin forming portion 23c for the circuit board 17 is located in the middle of a number of lead pin forming portions 23. Therefore, if the electronic circuit parts 28 are grounded to the circuit board 17 and the latter is electrically connected to the grounding lead pin forming portion 23c, the electronic circuit parts 28 can be grounded via the grounding lead pin forming portion 23c.

The grounding lead pin forming portion 23d for the metal package 21 having the optical functional element is located at the end of a number of lead pin forming portions 23, and the grounding lead pin forming portion 23d is electrically connected to the grounding lead member 27 via a connecting lead portion 26. Therefore, there is no need to connect the grounding lead portion 23d and the grounding lead member 27 by a wire.

If the grounding lead member 27 is to be connected to a grounding lead pin forming portion 23 other than the above portion 23d shown in FIG. 5, they may be connected to each other by a wire. Further, the lead frame 15 may be so shaped that the circuit board 17 and the metal package 21 may be grounded via a common grounding lead pin forming portion. For example, in the case of FIGS. 4 and 5, if the circuit board 17 is connected to the inner lead 23a of the grounding lead pin forming portion 23d for the metal package 21 by a wire, both of the circuit board 17 and the metal package 21 can be grounded via the single grounding lead pin forming portion 23d.

Figure 6:
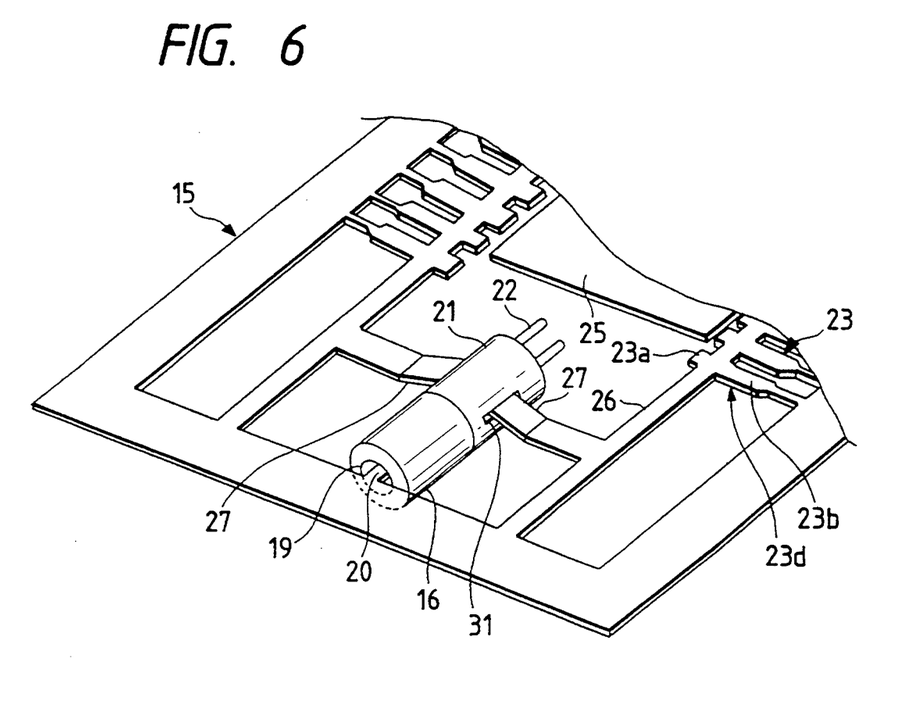
FIG. 6 is a perspective view showing an example of engagement between a metal package and grounding lead members.
Figure 7:
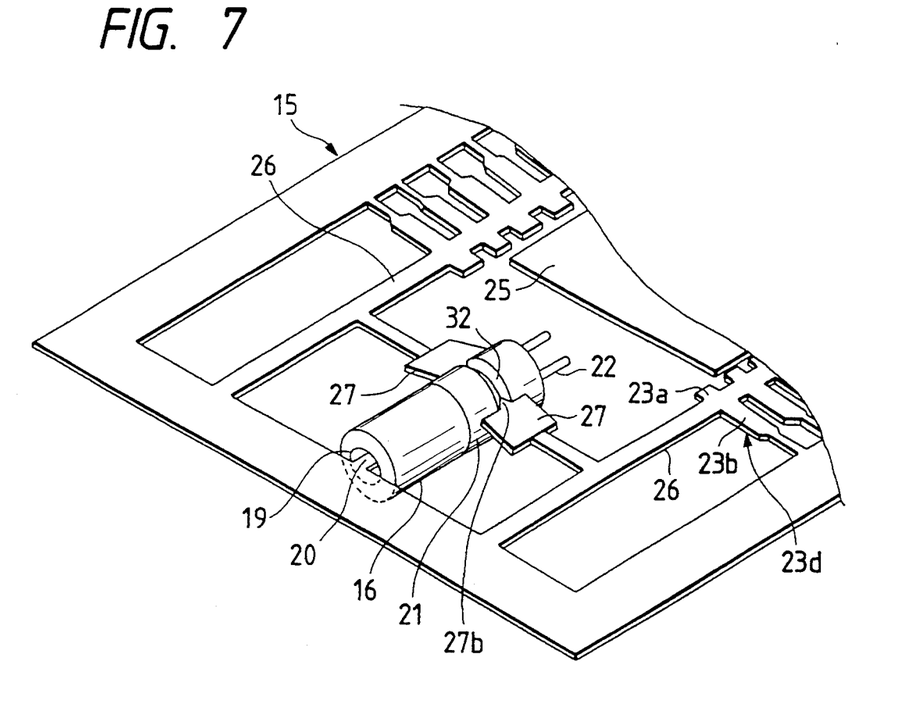
FIG. 7 is a perspective view showing another example of engagement the metal package and grounding lead members.

FIGS. 6 and 7 show two examples of engagement between the grounding lead members 27 and the metal package 21.

In the case of FIG. 6, the tip of each grounding lead members 27 is inserted into an engaging hole 31 formed in the outer surface of the metal package 21 along its axis. With this structure, since the grounding lead members 27 firmly contact with the metal package 21, the operation (e.g., welding) of electrically connecting those can be performed easily. Further, since the optical connector 16 is supported at three positions by the support member 20 and the grounding lead members 27, it can be easily positioned, for instance, when it is set in metal dies.

In the case of FIG. 7, a tip protrusion 27b of each grounding lead member 27 engages with an engaging groove 32 formed in the outer surface of the metal package 21 in its circumferential direction. With this structure, as in the case of FIG. 6 structure, since the tip of the grounding lead member 27 firmly contacts with the metal package 21, the operation (e.g., welding) of electrically connecting those can be performed quickly. To provide reliable connection between the metal package 21 and the grounding lead members 27, it is recommended that they be contacted with each other in as large an area as possible.

The operation (e.g., welding) of electrically connecting the metal package 21 and the grounding lead members 27 may be performed either before or after the resin molding using metal dies. Where it is performed before the resin molding, the connecting lead portion 26 for each grounding lead member 27 is made flexible so that the metal package 21 can easily be positioned in the metal dies for the resin molding (see FIG. 8). That is, the connecting lead portion 26 is zigzagged, so that the grounding lead member 27 connected thereto can move freely in both directions indicated by arrows A and B in FIG. 8.

Figure 8:
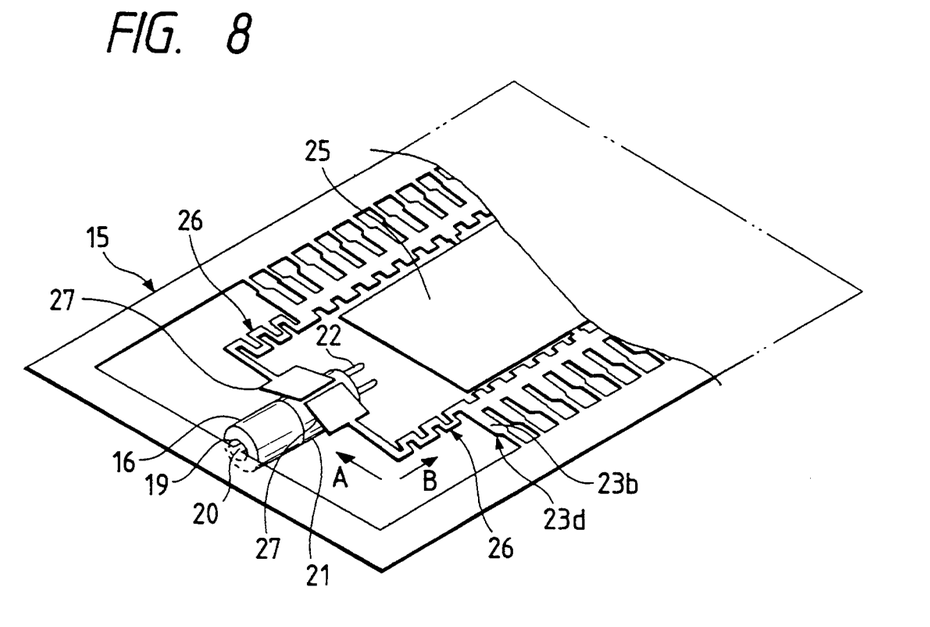
FIG. 8 is a perspective view showing a structure lot flexibly supporting a grounding lead member for the metal package.

With the supporting structure of FIG. 8, when the metal package 21 is positioned with respect to the metal dies, the grounding lead members 27 follow the movement of the metal package 21 and, therefore, the metal package 21 can easily be positioned before the resin injection. Since the molding can be performed so that the metal package 21 and the grounding lead members 27 are embedded in the resin mold member, it is recommended that only a part of the optical connector 16 be exposed from the resin mold member.

Where the operation (e.g., welding) of connecting the metal package 21 and the grounding lead members 27 is performed after the resin molding, the connecting portion of the metal package 21 is exposed from the resin mold member 35 as shown in FIG. 3. After the molding, the grounding lead members 27 are connected to the exposed connecting portion. With this method, since the grounding lead members 27 have not been connected to the metal package 21 at the time of positioning the metal package 21 in the metal dies, the metal package 21 can be positioned freely even if the connecting lead portions 26 are less flexible as in the case of FIGS. 4 and 5.

Figure 9:
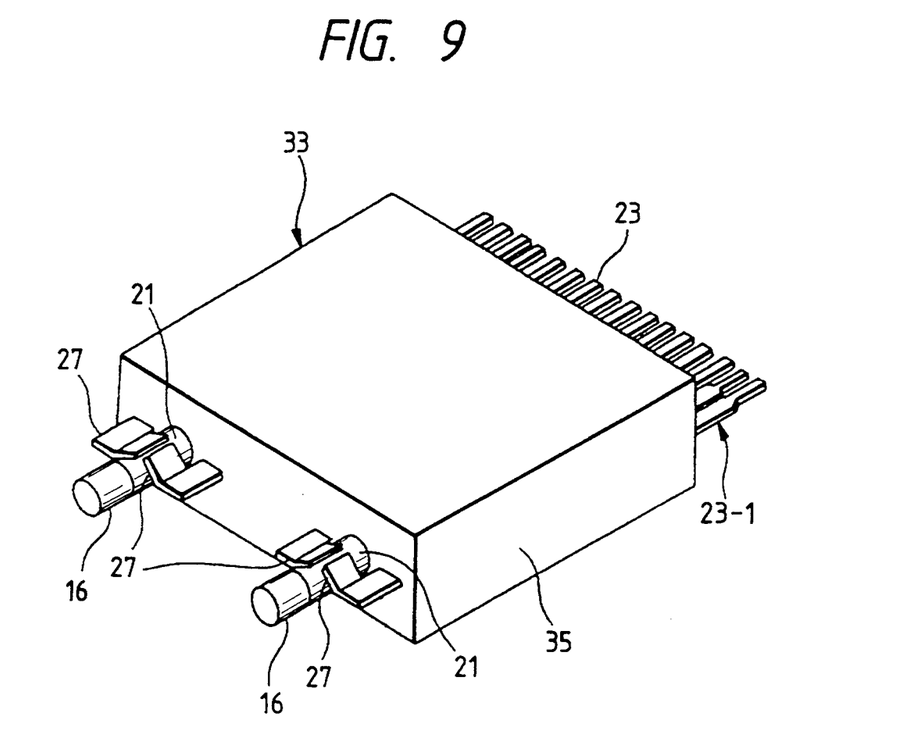
FIG. 9 is a perspective view of a transceiver-type optical module according to a second embodiment of the invention.
Figure 10:
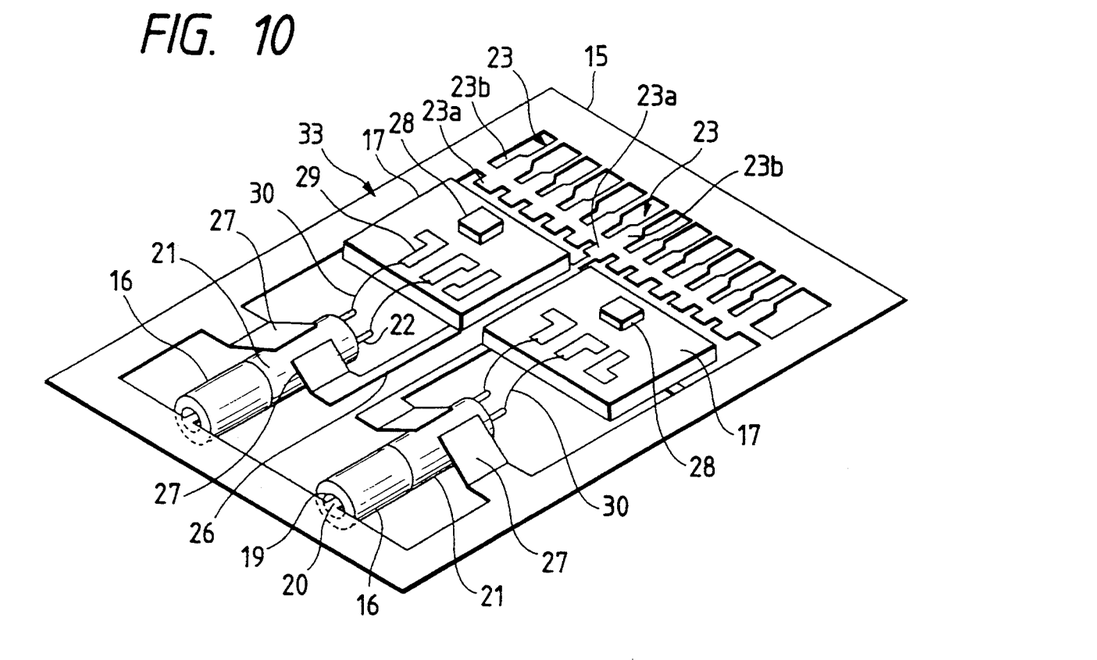
FIG. 10 is a perspective view of an assembly of the transceive-type optical module of FIG. 9 in a state before resin molding.
Figure 11:
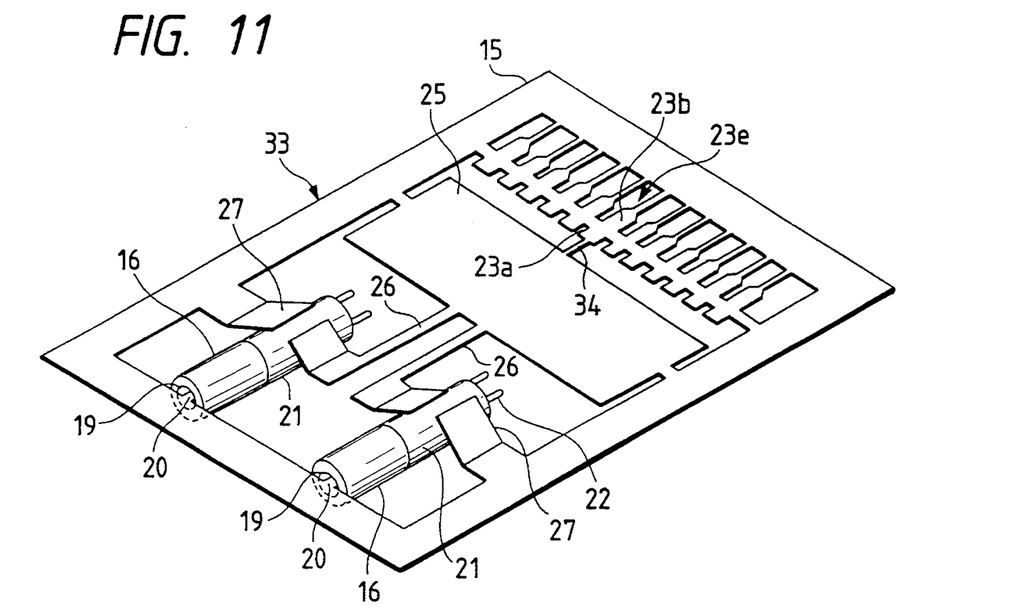
FIG. 11 is a perspective view of an assembly of the optical module of FIG. 9 in a state before a circuit board is mounted on a lead frame.

FIGS. 9–11 show an embodiment in which the invention is applied to an optical module 33, which is a double-fiber, transceiver-type optical data link. FIG. 9 is a perspective view of the optical module 33 in which electronic circuit parts 28 and other parts are held by a resin mold member 35. FIG. 10 is a perspective view of an assembly including a lead frame 15 and a circuit board 17 mounted thereon and having electronic circuit parts 28 in a state before being set in metal dies for resin molding. FIG. 11 is a perspective view of an assembly in a state before the circuit board 17 is mounted on the lead frame 15.

This transceiver-type optical module 33 is somewhat different from the optical module 18 of FIGS. 4 and 5 in the arrangement of lead pin forming portions 23. The two optical modules 18 and 33 are the same in the other constitution. More specifically, as shown in FIG. 11, in the optical module 33, a middle one of a number of lead pin forming portions 23 serves as a grounding lead pin forming portion 23e, and its inner lead portion 23a is connected to a mother land 25 via a bridging portion 34. Further, two of four grounding lead members 27 are connected to the mother land 25 via respective connecting lead portions 26, and the other two are connected to an outer portion of the lead frame 15. The circuit board 17 is connected to the mother land 25.

Therefore, in this optical module 33, each metal package 21, in which an optical functional element is incorporated, is grounded via one of the grounding lead members 27, grounding lead portion 26, mother land 25, bridging portion 34 and grounding lead pin forming portion 23e and via the other grounding lead member 27, outer lead portion, mother land 25, bridging portion 34 and grounding lead pin forming portion 23e. Further, the circuit board 17, which is connected to the mother land 25, is grounded via the bridging portion 34 and the grounding lead pin forming portion 23e.

In the optical module 33 of FIG. 9, since the portion of the metal package 21 to be electrically connected to the grounding lead members 27 is located outside the resin mold member 35, the grounding lead members 27 can be welded to the metal package 21 after the resin molding using metal dies. Therefore, in the state where the lead frame 15 is set in the metal dies while supporting optical connectors 16 and the metal packages 21, the metal packages 21 and the grounding lead members 27 can move freely. No problems occur in positioning the metal packages 21 even if the connecting lead portions 26 for the grounding lead members 27 have the structure as shown in FIGS. 10 and 11.

Figure 12:
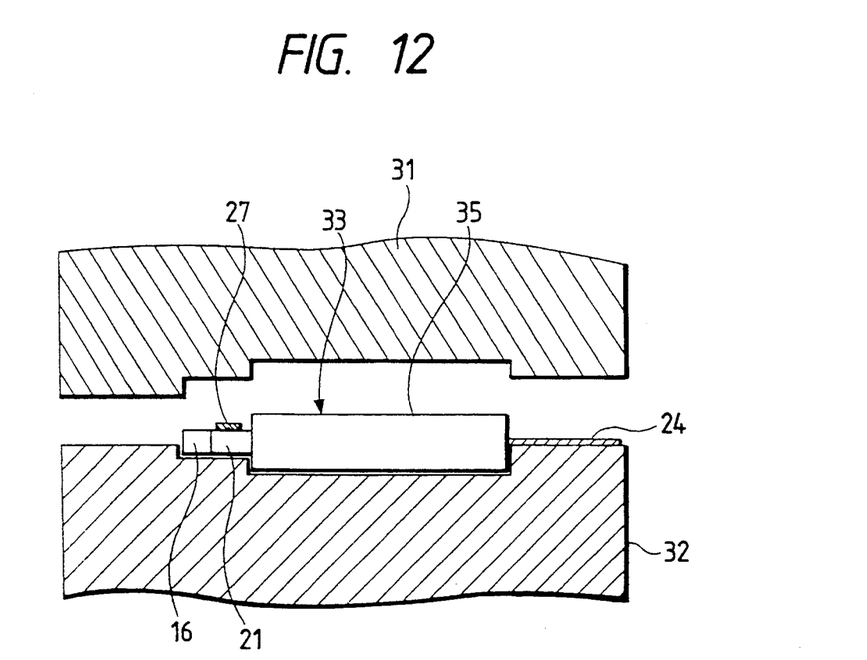
FIG. 12 is a sectional view showing a state in which tie-bars of the lead frame are cut out using metal dies at the same time as the grounding lead members are welded to the metal package.

As shown in FIG. 12, the grounding lead members 27 may be welded to the metal packages 21 after the resin molding at the same time as unnecessary portions such as tie-bars 24 of the lead frame 35 are cut out using cutter metal dies 31 and 32. This combination of the cutter metal dies and the welding structure will shorten the manufacturing process of the optical module.

It is noted that the integral pattern of the lead frame 15 to be punched which includes the lead pin forming portions 23, mother land 25, grounding lead members 27, etc. is not limited to the one illustrated in the above embodiments, but may be modified in a desired manner.

According to the invention, in the optical module in which the circuit board having the electronic circuit parts, the optical connector, the metal package having the optical functional element and the lead frame supporting those parts are held by the resin mold member, the metal package is grounded via the grounding lead members and the grounding lead pins that are parts of the lead frame. With the improved grounding, not only the optical functional element can well exhibits its characteristics but the resistance to noises can be improved.

What is claimed is:

1. An optical module comprising:
   an optical connector for receiving an end of an optical fiber to be connected to the optical module;
   an optical functional element to be optically coupled with the optical fiber;
   a metal package fixed to the optical connector and containing the optical functional element, the optical functional element being grounded to the metal package;
   electronic circuit parts electrically connected to the optical functional element;
   a circuit board on which the electronic circuit parts are mounted;
   a plurality of lead pins electrically connected to the electronic circuit parts;
   at least one grounding member electrically connected to the metal package;
   a grounding lead pin electrically connected to the grounding lead member; and
   a resin mold member holding the metal package, electronic circuit parts, circuit board, lead pins, grounding member and grounding lead pin.

2. The optical module of claim 1, wherein the metal package has, in its outer surface, a groove with which a tip of the grounding member is engaged.

3. The optical module of claim 1, further comprising a flexible connecting lead portion connecting the grounding member to the grounding lead pin while supporting the grounding member.

4. The optical module of claim 1, wherein the metal package and the grounding member is partially exposed from the resin mold member.

5. The optical module of claim 1, wherein the metal package and the grounding member is entirely contained in the resin mold member.

6. The optical module of claim 1, wherein the grounding member is a thin metal part formed by cutting a lead frame.

7. The optical module of claim 1, wherein the grounding member is a wire directly connected to the grounding lead pin.

8. The optical module of claim 1, further comprising a mother land on which the circuit board is mounted, the mother land serving to electrically connect the grounding member to the grounding lead pin.

9. The optical module of claim 1, wherein the electronic circuit parts are grounded to the grounding lead pin via the circuit board.

10. A manufacturing method of an optical module, comprising the steps of:
    preparing an assembly comprising a lead frame including a plurality of lead pin forming portions, at least one grounding lead member and a grounding lead pin forming portion electrically connected to the grounding lead member, a circuit board having electronic circuit parts and mounted on the lead frame, an optical connector supported by the lead frame, a metal package fixed to the optical connector and containing an optical functional element electrically connected to the electronic circuit parts and grounded to the metal package;
    electrically connecting the grounding lead member to the metal package; and
    molding the assembly with a resin to hold the metal package, electronic circuit parts, circuit board, lead pin forming portions, grounding lead member and grounding lead pin forming portion; and
    cutting out unnecessary portions of the lead frame.

11. The manufacturing method of claim 10, wherein a flexible connecting lead portion electrically connects the grounding lead member to the grounding lead pin forming portion while supporting the grounding lead member.

12. A manufacturing method of an optical module, comprising the steps of:
    preparing an assembly comprising a lead frame including a plurality of lead pin forming portions, at least one grounding lead member and a grounding lead pin forming portion electrically connected to the grounding lead member, a circuit board having electronic circuit parts and mounted on the lead frame, an optical connector supported by the lead frame, a metal package fixed to the optical connector and containing an optical functional element electrically connected to the electronic circuit parts and grounded to the metal package;
    molding the assembly with a resin to hold the metal package, electronic circuit parts, circuit board, lead pin forming portions, grounding lead member and grounding lead pin forming portion;
    electrically connecting the grounding lead member to the metal package; and
    cutting out unnecessary portions of the lead frame.

13. The manufacturing method of claim 12, wherein the steps of electrically connecting the grounding lead member to the metal package and cutting out unnecessary portions of the lead frame are performed simultaneously.

* * * * *